United States Patent
Guiles et al.

(10) Patent No.: US 6,703,114 B1
(45) Date of Patent: Mar. 9, 2004

(54) LAMINATE STRUCTURES, METHODS FOR PRODUCTION THEREOF AND USES THEREFOR

(75) Inventors: Chester Light Guiles, Highland, CA (US); Scott Timon Allen, Baldwin Park, CA (US); Ousama Najjar, Rancho Cucamonga, CA (US); William J. Bieschke, Milford, CA (US)

(73) Assignee: Arlon, Rancho Cucamonga, CA (US)

( * ) Notice: Subject to any disclaimer, the term of this patent is extended or adjusted under 35 U.S.C. 154(b) by 1 day.

(21) Appl. No.: 10/274,292

(22) Filed: Oct. 17, 2002

(51) Int. Cl.$^7$ ................................................. B32B 3/00
(52) U.S. Cl. ....................... 428/209; 428/458; 174/250; 174/255
(58) Field of Search ................ 428/209, 458; 174/250, 255

(56) References Cited

U.S. PATENT DOCUMENTS

| | | | | |
|---|---|---|---|---|
| 4,790,968 A | * | 12/1988 | Ohkawa et al. | 264/104 |
| 5,112,726 A | * | 5/1992 | Cohen et al. | 430/315 |
| 5,538,789 A | * | 7/1996 | Capote et al. | 428/344 |
| 5,541,366 A | | 7/1996 | Maoz et al. | |
| 5,733,639 A | | 3/1998 | Gosselin | |
| 5,910,354 A | * | 6/1999 | Meola et al. | 428/198 |
| 6,197,407 B1 | * | 3/2001 | Andou et al. | 428/209 |
| 6,356,245 B2 | | 3/2002 | Metzen et al. | |
| 6,366,259 B1 | | 4/2002 | Pruett et al. | |
| 6,451,441 B1 | * | 9/2002 | Nishimoto et al. | 428/461 |
| 6,518,514 B2 | * | 2/2003 | Suzuki et al. | 174/262 |

OTHER PUBLICATIONS

Dussopt et al., "Circularly polarized microstrip arrays built on polymethacrylate imide foam." Electronics Letters, 36(21): 1758–1759, 2000. No month.

Haskins and Dahele, "Low cost linear arrays using polystyrene foam substrate." IEE Colloquium (Digest), Institute of Electrical Engineers, Savoy Place, London, No. 206, p. 1/1–1/5, 1998. No month.

Lin et al., "Investigation of a light–weight composite–substrate for spaceborne microstrip bar antennas." Proceeding of the 2$^{nd}$ International Conference on Electromagnetics in Aerospace Applications, Politecnico di Torini, Torino, Italy, p. 425–428, 1991. No month.

Rostan et al., "Wideband aperture–coupled microstrip patch array for satellite TV reception." Eighth International Conference on Antennas and Propagation, Institute of Electrical Engineers, No. 370, vol. 1, p. 190–193. No date.

* cited by examiner

*Primary Examiner*—Cathy Lam
(74) *Attorney, Agent, or Firm*—Foley & Lardner; Stephen E. Reiter

(57) ABSTRACT

In accordance with the present invention, there are provided novel assemblies which are useful for a variety of applications. Invention assemblies have low dielectric constant, making them suitable for use in a variety of electronic applications. In addition, invention assemblies are resistant to attack by acidic aqueous media, basic aqueous media and/or organic media, making it possible to subject such assemblies to a variety of processing conditions, such as, for example, chemical etching to introduce circuitry thereto.

78 Claims, 6 Drawing Sheets

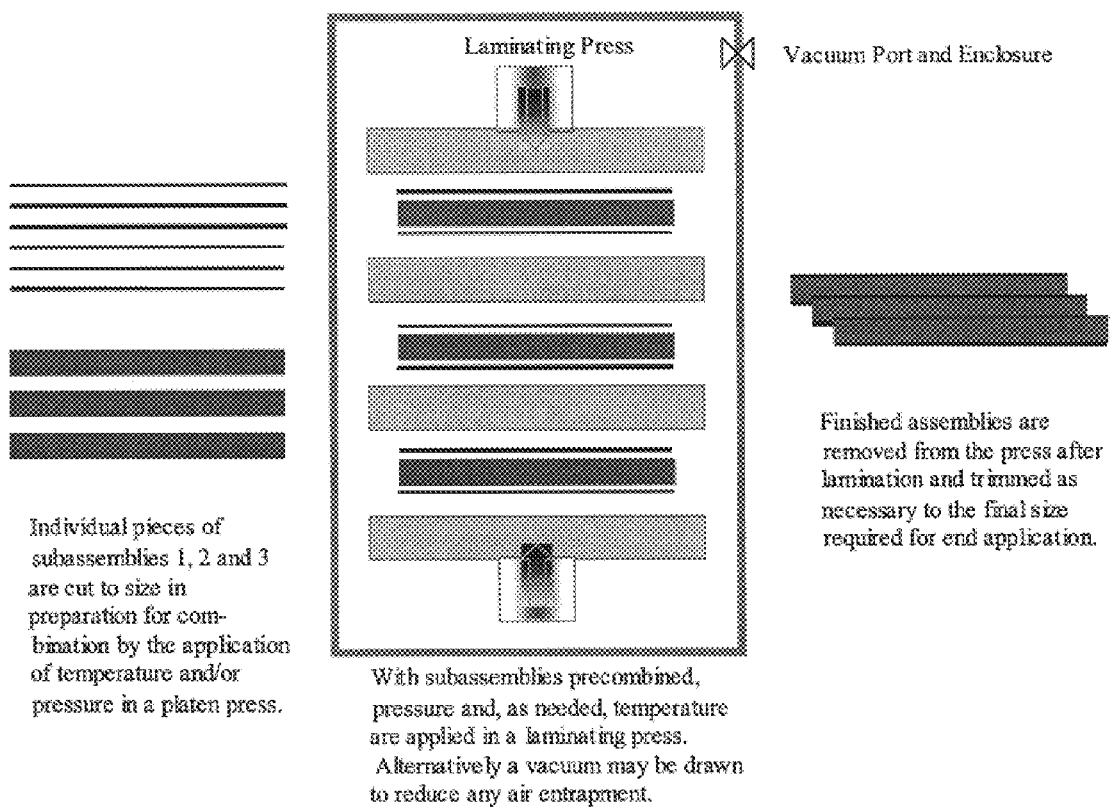

FIG. 5

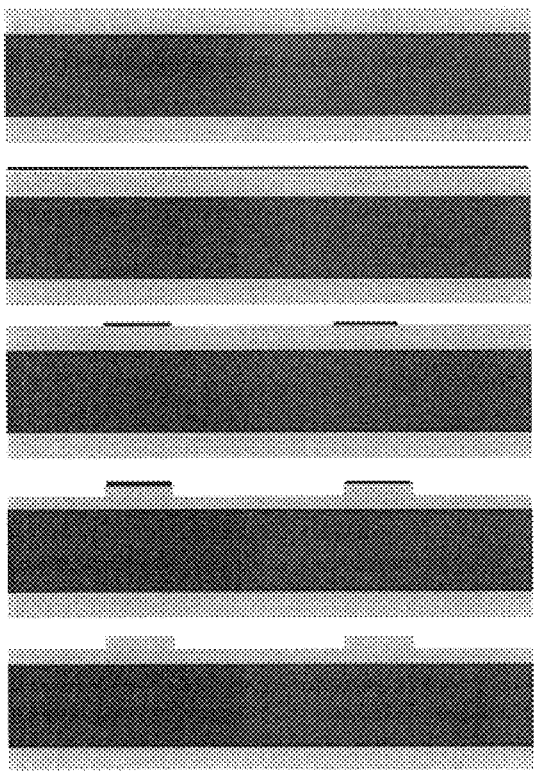

The as-received assembly showing the core, the impervious polymeric membrane and external copper foil A photoimageable "etch resist" is placed over the copper, exposed and developed.

The desired area of the mask remains as an etch resist.

The unprotected copper is removed using an aqueous acidic etch solution such as ammonium persulfate or cupric chloride.

Finally the remaining etch resist is stripped using a strong caustic (alkaline) solution leaving the desired circuit pattern. The copper on the other side constitutes a ground plane.

FIG. 6

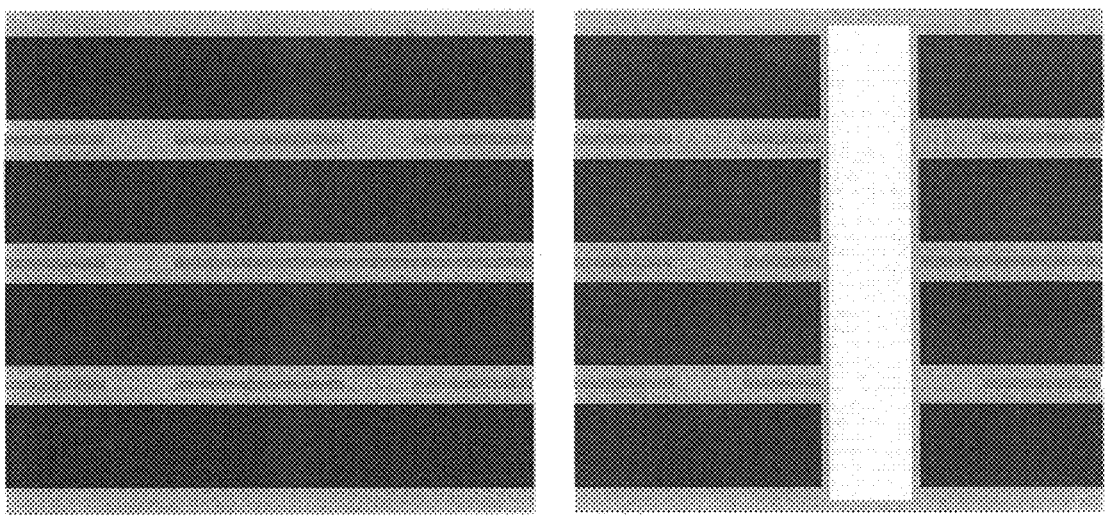

A plurality of printed circuits made from the assembly can be put together using an adhesive layer to bond each assembly to those above or below it. External copper in this example remains as ground planes on either side.

In an alternative embodiment of this invention, holes can be drilled in the material and plated with copper to permit electrical interconnection between various layers of the multilayer structure.

LAMINATE STRUCTURES, METHODS FOR PRODUCTION THEREOF AND USES THEREFOR

FIELD OF THE INVENTION

The present invention relates to laminate structures, methods for making such structures, and various uses therefor. In a particular aspect, the present invention relates to foam core assemblies useful for the preparation of microwave circuit assemblies, particularly antennas.

BACKGROUND OF THE INVENTION

A variety of composite structures are used in the electronics industry. Important considerations in the formation of such structures include the structural integrity of the finished structure, the ability of the resulting structure to withstand a variety of processing conditions after assembly thereof (e.g., processing conditions typical of printed circuit manufacture), the performance properties of the finished structure (e.g., the dielectric constant, resistance to moisture and other potentially harsh exposures, and the like), competitive cost, ease of manufacture, and so on.

Historically, in the production of printed circuit boards used as antennas and other elements of cellular and wireless infrastructure, conventional woven glass laminates based on PTFE (polytetrafluoroethylene) have been utilized. While these are readily and conveniently manufactured using technology well known to those of skill in the art, they tend to be expensive, are heavy (having a density of about 2.5) and are limited to a dielectric constant no lower than about 2.17.

There is, however, a growing need for low cost, lightweight antennas with dielectric constants lower than about 2.0, preferably closer to 1.5. In attempts to achieve this, the prior art teaches several variations on the use of rigid foams combined with metal foils.

For example, Gosselin (U.S. Pat. No. 5,733,639 describes methods for making a structure in which a microballoon-filled adhesive is used to bond metal foil directly to a rigid polyisocyanurate foam. While potentially useful in manufacturing individual antennas, the method is limited in that there is no true barrier to attack of the foam surface by process chemistries (both aqueous and organic) typical of printed wiring board manufacturing processes once the copper has been etched away. This results in degradation of and/or inconsistency in electrical properties and performance. In addition, the Gosselin method is not amenable to the high volume continuous manufacture necessary to produce product economically. Maoz et. al. (U.S. Pat. No. 5,541,366) teaches a similar approach without, however, specifying a particular adhesive to bond the copper to the foam core.

When it was attempted to resolve the issue of degraded electrical performance by using a polyurethane film adhesive to bond copper foil directly to a rigid Baltek polystyrene foam core at 350° F., doing so led to the partial structural collapse of the foam and did not result in an impermeable barrier between the copper and the foam. The resultant product had pinholes in the film/bonding layer, which resulted in the penetration of etch chemicals during processing. This confirmed the concern noted above with respect to the limited applicability of the Gosselin et. al. methodology.

In a similar experiment the foam itself was coated with a ceramic-filled resin system known to have good electrical properties. That system was B-staged for 3 minutes at 139° C. and then laminated for 90 minutes at 360° F. and 300 psi (typical PWB laminate manufacturing techniques). Again the foam collapsed due to heat and pressure, resulting in a material that was too dense and the seal between the copper and the foam was still inadequate to eliminate etchant penetration and entrapment in the foam structure. Clearly another approach to the problem is still needed.

Among the alternative approaches described in the art, Metzen et. al. (U.S. Pat. No. 6,356,245) teaches the use of two rigid foam layers bonded on opposite sides of a pre-formed microwave circuit (specifically a transmission line used as part of a beam-forming network for a microwave antenna), wherein the pre-formed circuit is formed on a piece of traditional laminate material as noted above. Such an approach is of limited applicability as it requires substantial assembly work after the circuit has been formed. Thus, while the Metzen methodology may be useful for forming a buried stripline circuit, it could not be used, for example, to form a surface microstrip pattern, such as is commonly found in antennas for cellular transmitter/receiver antennas.

Other functional, but technically problematic approaches have also been described in the art, such as for example, by first manufacturing a flexible printed circuit on a commercially available product such as Dupont's Pyralux® and then bonding that circuit to a foam core using adhesive. A critical deficiency in such an approach is especially notable when circuitry needs to be formed on both sides of a finished assembly, since critical and precise alignment of circuit features from side to side is difficult at best when gluing individual etched circuits on opposed sides of a piece of foam. Issues such as foam collapse (as described above) are also expected to arise when employing such an approach.

In summary, the prior art clearly does not provide a ready-to-use assembly that can be supplied to a printed circuit manufacturer and immediately subjected to conventional processing. For example, the prior art does not provide a barrier impervious to process chemicals and is, moreover, largely limited to the use of rigid foam cores to which there must be a secondary application of copper foil (which can easily result in a permeable surface) or pre-etched circuitry, which adds cost and complexity.

Accordingly, there is a clear need in the art for low cost, readily manufacturable, lightweight, low dielectric constant composite structures (and methods of making same) which can be supplied with conductive metal foils on one or both sides, have provision for an impervious barrier to protect the underlying core material from attack by process chemistries, and can be subjected to a variety of industrial processing conditions, and thereby used in a variety of electronic applications. The present invention satisfies these and related needs, as described in greater detail in the following specification and claims.

SUMMARY OF THE INVENTION

In accordance with the present invention, there are provided novel assemblies which are useful for a variety of microwave/RF applications. Invention assemblies have low dielectric constant, making them suitable for use in a variety of electronic applications. In addition, invention assemblies are resistant to attack by acidic aqueous media, basic aqueous media and/or organic media, making it possible to subject such assemblies to a variety of processing conditions commonly used in PCB manufacturing, such as, for example, chemical etching to introduce circuitry thereto.

BRIEF DESCRIPTION OF THE FIGURES

FIG. 4 illustrates an alternative method of manufacturing the assembly of FIG. 1 using pre-sheeted pieces of both subassemblies and combining them in a flat laminating press to provide pressure and/or temperature.

FIG. 5 illustrates a method of producing a microwave or RF printed circuit using an assembly according to the present invention.

FIG. 6 illustrates a method of combining a plurality of the circuits produced by the method of FIG. 5 into a multilayered structure.

DETAILED DESCRIPTION OF THE INVENTION

Figure 1:
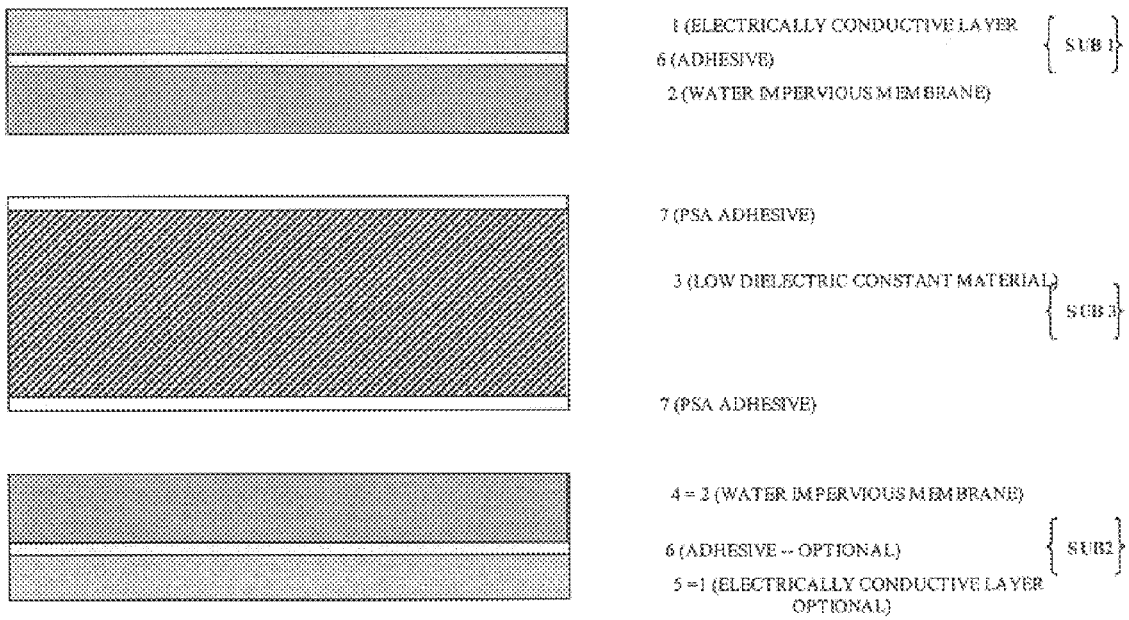
FIG. 1 illustrates the components employed to make an assembly according to the invention.

In accordance with the present invention, there are provided assemblies comprising:

a first conductive layer, a first substantially water impervious membrane, a support layer comprising material having a low dielectric constant, a second substantially water impervious membrane, and optionally, a second conductive layer.

Conductive layers contemplated for use in the practice of the present invention are typically electrically conductive, although non-conductive layers can also be employed in the practice of the present invention. Exemplary electrically conductive layers include copper or an alloy thereof, nickel or an alloy thereof, nickel or nickel alloy plated copper, rolled copper-invar-copper, aluminum, and the like, as well as combinations of any two or more thereof.

It is presently preferred that the first electrically conductive layer employed in the practice of the present invention is copper or an alloy thereof. Similarly, it is presently preferred that the optional second electrically conductive layer, when employed in the practice of the present invention, is copper or an alloy thereof.

In a particularly preferred embodiment of the present invention, the first electrically conductive layer is capable of being converted into frequency dependent circuitry. This can be accomplished employing standard methodology, i.e., the invention assembly provides the advantage that it can be subjected to conventional processing conditions for the preparation of circuitry thereon.

In another particularly preferred embodiment of the present invention, the second electrically conductive layer may be formed into a second frequency dependent circuit element, or it may be left intact to define a ground plane. This also can be prepared employing standard methodology.

Substantially water impervious membranes contemplated for use in the practice of the present invention are resistant to such exposure as acidic aqueous media, basic aqueous media, and/or organic media such as are typical in the manufacture of etched printed circuits.

As readily recognized by those of skill in the art, a variety of media are commonly employed for the preparation and processing of electronic circuitry. Such media include, for example, acidic aqueous media (which embraces aqueous solutions having a pH of less than 7, down to a pH of about 1 or less), basic aqueous media (which embraces aqueous solutions having a pH of greater than 7, up to about 13 or higher), and organic media (which embraces non-polar organic solvents such as hydrocarbons, aromatics, and the like, polar organic solvents such as esters, halogenated hydrocarbons, and the like).

Substantially water impervious membranes contemplated for use in the practice of the present invention can be prepared from a variety of materials, such as, for example, polymers such as polyesters, polyolefins, polyamides, polyethers, polyether-etherketones, polyimides, polyetherimides, polysulfones, polysulfonyls, polyethersulfones, poly(meth)acrylates, polyurethanes, epoxies, polysiloxanes, polyphenylene oxides, and the like, including combinations of any two or more thereof. As used herein, "combinations" embrace blends, copolymers, coplanar layers, and the like, of any two or more of the above polymeric materials.

As used herein, "polyesters" refers to polymeric materials with a plurality of ester (—C(O)—O—) linkages. Exemplary polyesters contemplated for use in the practice of the present invention include polyethylene terephthalate (PET), polyethylene naphthenate (PEN), and the like.

As used herein, "polyolefin" embraces polymers of unsaturated hydrocarbons or substituted hydrocarbons, such as, for example, neoprene, polyvinyl systems, polybutylenes, polyisoprenes, polybutadienes, polymethylpentenes, polyvinylidene fluorides, polyethylene-chlorotrifluoroethylenes, polytetrafluoroethylenes, polystyrenes, and the like, as well as combinations of any two or more thereof.

As used herein, "polyamides" refers to polymeric materials with a plurality of amide (—C(O)—NR—) linkages. Exemplary polyamides contemplated for use in the practice of the present invention include nylon films.

As used herein, "polyethers" refers to polymeric materials with a plurality of ether (—O—) linkages.

As used herein, "polyether-etherketones" refers to polymeric materials with a plurality of ether-etherketone (—O—[polymer]—O—C(O)—) linkages. Exemplary polyether-etherketones contemplated for use in the practice of the present invention include PEEK film.

As used herein, "polyimides" refers to polymeric materials with a plurality of imide (—C(O)—NR—C(O)—) linkages. Exemplary imides contemplated for use in the practice of the present invention include Kapton® polyimide film and Pyralux® copper-clad polyimide film, both available from Dupont Company.

As used herein, "polyetherimides" refers to polymeric materials with a plurality of etherimide (—O—C(O)—NR—C(O)—) linkages. Exemplary polyetherimides contemplated for use in the practice of the present invention include Ultem® PEI from General Electric Plastics.

As used herein, "polysulfones" refers to polymeric materials with a plurality of sulfone (—SO$_2$—) linkages.

As used herein, "polysulfonyls" refers to polymeric materials with a plurality of sulfonyl (—SO$_2$—) linkages.

As used herein, "polyethersulfones" refers to polymeric materials with a plurality of ether-sulfone (—O—SO$_2$—) linkages.

As used herein, "poly(meth)acrylates" refers to polymeric materials with a plurality of (meth)acrylate (—CR=CR—C(O)—O—) linkages, wherein R is hydrogen or methyl.

As used herein, "polyurethanes" refers to polymeric materials with a plurality of urethane (—NR—C(O)—O—) linkages.

As used herein, "epoxies" refers to polymeric materials derived from a plurality of epoxy molecules.

As used herein, "polysiloxanes" refers to polymeric materials with a plurality of siloxane (—Si(O)$_4$—) linkages.

As used herein, "polyphenylene oxides" refers to polymeric materials with a plurality of penylene oxide (—Ph—O—) linkages.

Substantially water impervious membranes contemplated for use in the practice of the present invention can optionally further comprise polymeric materials or combinations of same as indicated above that additionally include a reinforcing material. Exemplary reinforcing materials include woven glass, non-woven glass, woven aramid fibers, non-woven aramid fibers, woven liquid crystal polymer fibers, non-woven liquid crystal polymer fibers, woven synthetic polymer fibers, non-woven synthetic polymer fibers, randomly dispersed fiber reinforcements (such as chopped glass or aramid fibers), and the like.

As readily recognized by those of skill in the art, the thickness of the substantially water impervious membranes employed in the preparation of assemblies according to the invention can vary widely, typically falling in the range of about 10 up to about 250 microns. Preferably, the thickness of the substantially water impervious membrane employed in the practice of the present invention will fall in the range of about 25 to 75 microns.

Support layers contemplated for use in the practice of the present invention typically comprise a microporous polymeric material having a controlled void volume, such as, for example, a structural foam, a microvoid-containing polymeric material, a thermoplastic polymer capable of being imparted with a controlled pore volume, a thermoset polymer capable of being imparted with a controlled pore volume, and the like, including mixtures or conjoined layers of any two or more thereof.

As readily recognized by those of skill in the art, a variety of polymeric materials can be used for the preparation of support layers suitable for use in the practice of the present invention, such as, for example, polyolefins, polystyrenes, polyurethanes, polymethylimides, expanded rubbers, polyvinyl chlorides, and the like, as well as mixtures or conjoined layers of any two or more thereof.

As readily recognized by those of skill in the art, the thickness of support layers suitable for use in the practice of the present invention can vary widely, typically falling in the range of about 0.010 up to about 0.5 inches. Preferred thicknesses generally fall in the range of about 0.030 up to about 0.125 inches. Those of skill in the art can readily determine suitable thickness material to employ, depending on the end use intended for the resulting assembly.

Similarly, those of skill in the art readily recognize that the void volume of microporous polymeric materials contemplated for use in the practice of the present invention can also vary widely, typically falling in the range of about 10 up to about 98 percent. As readily recognized by those of skill in the art, the preferred void volume will vary, depending on the end use intended for the resulting assembly. For example, when multiple assemblies are employed, with one or more through-holes drilled therethrough, a microporous material with less void volume (e.g., a foam having a density of about 6 lb/cu ft) is suitable, whereas in other applications where no drilling of the support layer is contemplated, microporous materials with substantially higher void volumes (e.g., a foam having a density as low as about 2 lb/cu ft, or lower) is suitable. For many electronic applications, microporous polymeric materials having in the range of about 90–98% void volume are presently preferred.

Figure 2:
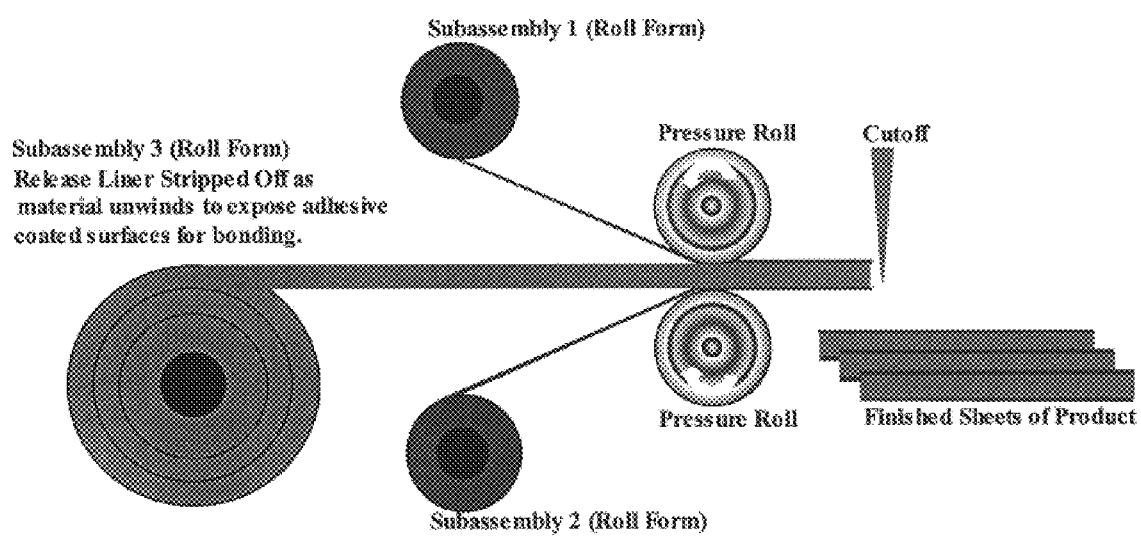
FIG. 2 illustrates a method of continuously manufacturing the assembly of FIG. 1 using a roll-to-roll laminating process.

In a particularly preferred embodiment of the present invention the microporous material of the support layer will be sufficiently flexible to permit it to be supplied in roll form to facilitate the continuous manufacturing process (FIG. 2).

In accordance with one aspect of the present invention, each of the components of the invention assembly are adhesively attached to one another employing a suitable adhesive. Suitable adhesives are those which are (1) resistant to attack by acidic aqueous media, basic aqueous media and/or organic media, (2) cure to a non-tacky surface, and/or (3) impart minimal impact on the electrical properties of the finished assembly. In addition, suitable adhesives are those which are suitable for curing by UV, thermal or radical processes, including pressure sensitive adhesives, which are particularly useful for the continuous bonding of the support material to the conductive foil/polymer film sub-assemblies of the invention (FIG. 1). As readily recognized by those of skill in the art, the demands on the adhesive will vary depending on the position within the invention assembly where the adhesive is employed.

As readily recognized by those of skill in the art, a wide variety of adhesives are suitable for use in the practice of the present invention, such as, for example, epoxies, polyesters, acrylics, urethanes, rubbers, cyanoacrylates, and the like, as well as combinations of any two or more thereof.

Assemblies according to the invention have desirable dielectric properties which renders invention assemblies suitable for a variety of applications, such as, for example, the fabrication of antenna structures. Typically, the dielectric constant of invention assemblies falls in the range of about 1.15 up to about 3.5, with assemblies having a dielectric constant under 2 being presently preferred. Especially preferred assemblies according to the invention have dielectric constants as low as 1.2 up to about 1.7.

In accordance with another embodiment of the present invention, there are provided methods for preparing assemblies as described herein, said methods comprising adhesively applying a first sub-assembly and a second sub-assembly to a core material having a low dielectric constant, wherein:

said first sub-assembly comprises:
    a first conductive layer, and
    a first substantially water impervious membrane, and
said second sub-assembly comprises
    a second substantially water impervious membrane, and
    optionally, a second conductive layer.

An illustration of the components which are assembled in the preparation of invention assemblies is presented in FIG. 1.

In one aspect, invention methods can be carried out employing continuous lengths of the first and second sub-assemblies (e.g., in roll form). Similarly, invention methods can be carried out employing continuous lengths of the core material having a low dielectric constant. Presently preferred are continuous lengths of core material with adhesive already applied to both sides thereof. In an especially preferred aspect, core material having a low dielectric constant is further provided with a release liner on one or both sides thereof.

Figure 3:
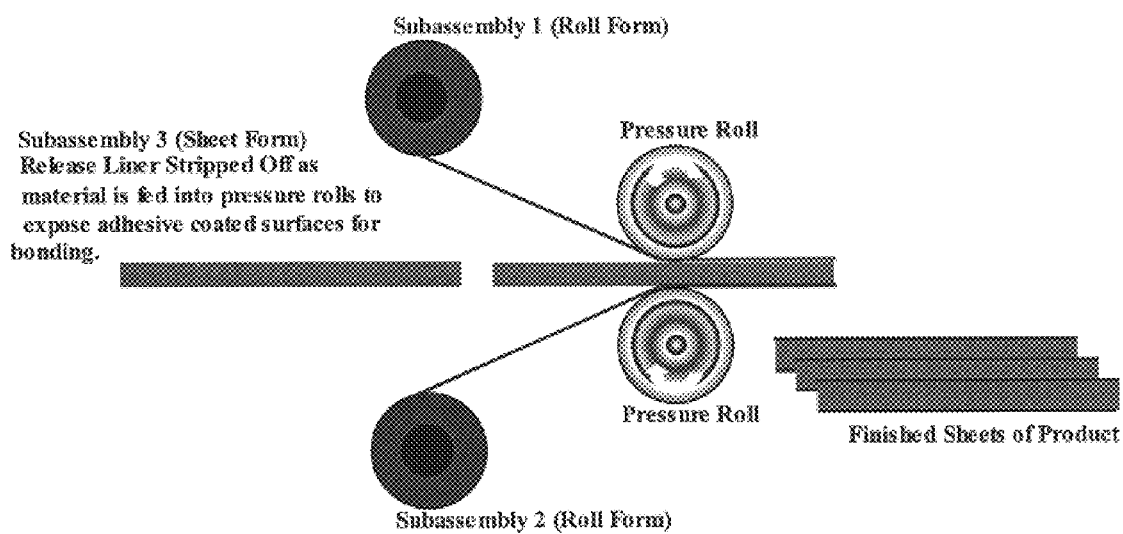
FIG. 3 illustrates an alternative method of continuously manufacturing the assembly of FIG. 1 using a sheet-fed roll-to-roll lamination process.

As readily recognized by those of skill in the art, the invention methods can be carried out in a variety of ways; see, for example, FIGS. 2, 3, and 4, wherein the first sub-assembly, the core material having a low dielectric constant and the second sub-assembly can be passed through a controlled gap between two rolls with sufficient pressure applied to produce the desired assembly with substantially no air entrapped between the layers thereof, and without substantially altering the thickness of the core material. This can conveniently be carried out using feed materials in sheet form, wherein the desired size and/or shape is cut from the sheet after the layers are pressed together to form the invention assembly.

Alternatively, the first sub-assembly, the core material having a low dielectric constant and the second sub-assembly can first be cut to the desired size and/or shape, and thereafter subjected to sufficient pressure to produce the invention assembly with substantially no air entrapped between the layers thereof, and without substantially altering the thickness of the core material.

In accordance with another embodiment of the present invention, there are provided methods for preparing assemblies useful for the formation of foam-filled frequency dependent circuitry, said methods comprising subjecting an invention assembly as described herein to processing suitable to create circuitry on the first conductive layer and/or circuitry or a ground plane on the second conductive layer of said assembly. Such processing typically involves a combination of steps such as photoimaging and chemical etching, and the like, to form the finished circuitry.

Invention methods can be used to produce such products as microwave antennas, low impedance microwave couplers, or any of a number of high frequency circuits where low dielectric constant, low loss, and the like are desirable attributes, and the like.

In accordance with another aspect of the present invention, there are provided methods for the production of multiple circuits on a single large sheet of invention assembly. This is accomplished by creating a plurality of circuits by a so-called "Step and Repeat" photoimaging process on the first conductive layer of an invention assembly.

As readily recognized by those of skill in the art, invention assemblies can be applied to any of a variety of substrates for use. For example, circuits produced employing invention assemblies can be mounted on support structures, such as aluminum or composite materials intended as stiffeners, or the like, or can be combined with covers that act as protection from weather, for instance.

In accordance with yet another aspect of the present invention, there are provided multilayer assemblies comprising a plurality of the above-described assemblies of the invention (see, for example, FIG. 6). As readily recognized by those of skill in the art, a "plurality" of assemblies embraces stacking 2 up to greater than about 20 assemblies to produce complex interconnected circuitry. Optionally, such stacked assemblies may be internally interconnected by one or more through-holes.

The invention will now be described in greater detail with reference to the following non-limiting examples.

Example 1

Voltek Volara Grade EO 6 lb/cu ft polyolefin foam 0.032"thick was coated with a commercial PSA (pressure sensitive adhesive; ATW2 from Arlon Adhesives and Films Division, Santa Ana, Calif.) and nip laminated (FIG. 2) via the sheet fed method to a copper polyester subassembly, Arlon CPL031ED0024 composed of 1 ounce copper adhered to a 3 mil Mylar® film (available from Arlon Engineered Coatings and Laminates, East Providence, R.I.). The assembly so produced had an overall thickness of 0.038", copper peel strength of >11 lb/in and a dielectric constant of 1.35 tested at 1.5 GHz.

Example 2

The assembly of Example 1 was evaluated by an antenna manufacturer and was processed through a standard printed circuit process with no indication of process problems. Patch antennas thus produced exhibited microwave transmission properties within the range expected for dielectric constant 1.3 to 1.4. In addition, the invention assemblies were reported to provide excellent resistance to passive intermodulation distortion, of particular importance to antenna manufacturers. Additionally it was observed that, despite the relatively low melting range of the foam support layer, the product could be acceptably soldered using a reduced solder temperature and hold time.

Example 3

The assembly of Example 1 was processed into a test printed circuit by a conventional PWB manufacturer using a variety of print and etch processes. The material processed acceptably. In addition, the invention assemblies were determined to be amenable to drilling and copper plating applied in the drilled hole. The adhesive used to bond the copper to the polyester was observed to absorb a small amount of blue dye from a resist stripping operation.

Example 4

The process of Example 1 was repeated using an alternative copper polyester film assembly, Sheldahl G1802 (available from Sheldahl, Northfield, Minn.). The resulting assembly was then subjected to the same method referred to in Example 3 with no indication of absorption of the blue dye. While the chemistry and composition of various baths in the PWB process may vary, the results of this experiment indicate that the particular adhesive employed for preparation of the sub-assembly can be selected so as to be compatible with the specific process conditions to which the resulting assembly will be exposed, as desired.

Example 5

An assembly according to the invention was prepared using a lightweight 2 lb/cu ft foam (0.093" thick) with the same copper polyester subassembly of Example 1. The resulting assembly was not found to be practical for drilling a hole therein and copper plating same as the foam density was too light and the material tore during drilling.

Example 6

A sample of foam support material 0.093" thick was prepared by combining three pieces of PSA coated foam 0.031" thick and subjected to the same evaluation as described in Example 5. It was observed that this approach resulted in there being too much total adhesive in the system, which caused fouling of the drill bits. This suggests that a single layer of the foam support material is preferably used to facilitate drilling of the resulting assembly.

Example 7

The process of Example 1 was repeated using Voltek Volara Type A foam (available from Voltek, Lawrence, Mass.), which is a thermally stable grade of foam. Upon heating the final assemblies of Example 1 and this example side-by-side at 180° F. it was found that the shrinkage and distortion of the Type A foam was significantly better than that of the Type EO foam. Other properties of the resulting assemblies remained substantially the same.

While the invention has been described in detail with reference to certain preferred embodiments thereof, it will be understood that modifications and variations are within the spirit and scope of that which is described.

That which is claimed is:

1. An assembly comprising:
   a first conductive layer,
   a first substantially water impervious membrane,
   a support layer, wherein said support layer comprises microporous polymeric material having a low dielectric constant and a controlled void volume,
   a second substantially water impervious membrane, and optionally, a second conductive layer.

2. An assembly according to claim 1 wherein said conductive layers are electrically conductive.

3. An assembly according to claim 2 wherein said first electrically conductive layer is copper or an alloy thereof, nickel or an alloy thereof, nickel or nickel alloy plated copper, rolled copper-invar-copper, aluminum, or a combination of any two or more thereof.

4. An assembly according to claim 2 wherein said first electrically conductive layer is copper or an alloy thereof.

5. An assembly according to claim 2 wherein said first electrically conductive layer is capable of being converted into frequency dependent circuitry.

6. An assembly according to claim 1 wherein said first substantially water impervious membrane is resistant to acidic aqueous media, basic aqueous media, and/or organic media.

7. An assembly according to claim 6 wherein said first substantially water impervious membrane is prepared from a polymer selected from the group consisting of a polyester, a polyolefin, a polyamide, a polyether, a polyether-etherketone, a polyimide, a polyetherimide, a polysulfone, a polysulfonyl, a polyethersulfone, a poly(meth)acrylate, a polyurethane, an epoxy, a polysiloxane, a polyphenylene oxide, and combinations of any two or more thereof.

8. An assembly according to claim 7 wherein said first substantially water impervious membrane further comprises a reinforcing material.

9. An assembly according to claim 8 wherein said reinforcing material is selected from the group consisting of woven glass, non-woven glass, woven aramid fibers, non-woven aramid fibers, woven liquid crystal polymer fibers, non-woven liquid crystal polymer fibers, woven synthetic polymer fibers, non-woven synthetic polymer fibers, and randomly dispersed fiber reinforcements.

10. An assembly according to claim 6 wherein said first substantially water impervious membrane has a thickness in the range of about 10 up to about 250 microns.

11. An assembly according to claim 1 wherein said microporous polymeric material is a structural foam, a microvoid-containing polymeric material, a thermoplastic polymer capable of being imparted with a controlled pore volume, a thermoset polymer capable of being imparted with a controlled pore volume, and mixtures or conjoined layers of any two or more thereof.

12. An assembly according to claim 11 wherein said polymeric material is selected from the group consisting of a polyolefin, a polystyrene, a polyurethane, a polymethylimide, an expanded rubber, a polyvinyl chloride, and mixtures or conjoined layers of any two or more thereof.

13. An assembly according to claim 1 wherein said microporous polymeric material having a controlled void volume has a thickness in the range of about 0.010 up to about 0.5 inches.

14. An assembly according to claim 1 wherein the void volume of said microporous polymeric material falls in the range of about 10 up to about 98 percent.

15. An assembly according to claim 1 wherein said second substantially water impervious membrane is resistant to acidic aqueous media, basic aqueous media, and/or organic media.

16. An assembly according to claim 15 wherein said second substantially water impervious membrane is prepared from a polymer selected from the group consisting of a polyester, a polyolefin, a polyamide, a polyether, a polyether-etherketone, a polyimide, a polyetherimide, a polysulfone, a polysulfonyl a polyethersulfone, a poly(meth)acrylate, a polyurethane, an epoxy, a polysiloxane, a polyphenylene oxide, and combinations of any two or more thereof.

17. An assembly according to claim 11 wherein said second substantially water impervious membrane has a thickness in the range of about 10 up to about 250 microns.

18. An assembly according to claim 2 wherein said second electrically conductive layer is copper or an alloy thereof, nickel or an alloy thereof, nickel or nickel alloy plated copper, rolled copper-invar-copper, aluminum, or a combination of any two or more thereof.

19. An assembly according to claim 2 wherein said second electrically conductive layer is copper or an alloy thereof.

20. An assembly according to claim 18 wherein said second conductive layer defines a ground plane.

21. An assembly according to claim 1 wherein said first conductive layer is adhesively attached to said first substantially water impervious membrane employing a suitable adhesive.

22. An assembly according to claim 21 wherein said suitable adhesive is (1) resistant to attack by acidic aqueous media, basic aqueous media and/or organic media, (2) cures to a non-tacky surface, and/or (3) does not raise the dielectric constant of the finished assembly to more than 3.5.

23. An assembly according to claim 21 wherein said suitable adhesive is suitable for curing by UV, thermal or radical processes.

24. An assembly according to claim 23 wherein said suitable adhesive is selected from the group consisting of an epoxy, a polyester, an acrylic, a urethane, a rubber, a cyanoacrylate, and combinations of any two or more thereof.

25. An assembly according to claim 1 wherein said first substantially water impervious membrane layer is adhesively attached to said support layer employing a suitable adhesive.

26. An assembly according to claim 25 wherein said suitable adhesive is a pressure sensitive adhesive.

27. An assembly according to claim 25 wherein said suitable adhesive is suitable for curing by UV, thermal or radical processes.

28. An assembly according to claim 26 wherein said suitable adhesive is selected from the group consisting of an epoxy, a polyester, an acrylic, a urethane, a rubber, a cyanoacrylate, and combinations of any two or more thereof.

29. An assembly according to claim 1 wherein said support layer is adhesively attached to said second substantially water impervious membrane employing a suitable adhesive.

30. An assembly according to claim 29 wherein said suitable adhesive is a pressure sensitive adhesive.

31. An assembly according to claim 29 wherein said suitable adhesive is suitable for curing by UV, thermal or radical processes.

32. An assembly according to claim 31 wherein said suitable adhesive is selected from the group consisting of an epoxy, a polyester, an acrylic, a urethane, a rubber, a cyanoacrylate, and combinations of any two or more thereof.

33. An assembly according to claim 1 wherein said second conductive layer is adhesively attached to said second substantially water impervious membrane employing a suitable adhesive.

34. An assembly according to claim 33 wherein said suitable adhesive is (1) resistant to attack by acidic aqueous media, basic aqueous media and/or organic media, (2) cures to a non-tacky surface, and/or (3) does not raise the dielectric constant of the fished assembly to more than 3.5.

35. An assembly according to claim 33 wherein said suitable adhesive is suitable for curing by UV, thermal or radical processes.

36. An assembly according to claim 35 wherein said suitable adhesive is selected from the group consisting of an epoxy, a polyester, an acrylic, a urethane, a rubber, a cyanoacrylate, and combinations of any two or more thereof.

37. An assembly according to claim 1 wherein the dielectric constant of the assembly falls in the range of about 1.15 up to about 3.5.

38. A stacked assembly comprising a plurality of assemblies according to claim 1.

39. An assembly comprising:
a first conductive layer,
a first substantially water impervious membrane,
a support layer comprising material having a low dielectric constant, wherein said first substantially water impervious membrane is adhesively attached to said support layer employing a suitable adhesive,
a second substantially water impervious membrane, and
optionally, a second conductive layer.

40. An assembly according to claim 39 wherein said first conductive layer is electrically conductive.

41. An assembly according to claim 40 wherein said first electrically conductive layer is copper or an alloy thereof, nickel or an alloy thereof, nickel or nickel alloy plated copper, rolled copper-invar-copper, aluminum, or a combination of any two or more thereof.

42. An assembly according to claim 40 wherein said first electrically conductive layer is copper or an alloy thereof.

43. An assembly according to claim 40 wherein said first electrically conductive layer is capable of being converted into frequency dependent circuitry.

44. An assembly according to claim 39 wherein said first substantially water impervious membrane is resistant to acidic aqueous media, basic aqueous media, and/or organic media.

45. An assembly according to claim 44 wherein said first substantially water impervious membrane is prepared from a polymer selected from the group consisting of a polyester, a polyolefin, a polyamide, a polyether, a polyether-etherketone, a polyimide, a polyetherimide, a polysulfone, a polysulfonyl, a polyethersulfone, a poly(meth)acrylate, a polyurethane, an epoxy, a polysiloxane, a polyphenylene oxide, and combinations of any two or more thereof.

46. An assembly according to claim 44 wherein said first substantially water impervious membrane further comprises a reinforcing material.

47. An assembly according to claim 46 wherein said reinforcing material is selected from the group consisting of woven glass, non-woven glass, woven aramid fibers, non-woven aramid fibers, woven liquid crystal polymer fibers, non-woven liquid crystal polymer fibers, woven synthetic polymer fibers, non-woven synthetic polymer fibers, and randomly dispersed fiber reinforcements.

48. An assembly according to claim 39 wherein said first substantially water impervious membrane has a thickness in the range of about 10 up to about 250 microns.

49. An assembly according to claim 39 wherein said support layer is selected from the group consisting of a structural foam, a microvoid-containing polymeric material, a thermoplastic polymer capable of being imparted with a controlled pore volume, a thermoset polymer capable of being imparted with a controlled pore volume, and mixtures or conjoined layers of any two or more thereof.

50. An assembly according to claim 39 wherein said support layer is selected from the group consisting of a polyolefin, a polystyrene, a polyurethane, a polymethylimide, an expanded rubber, a polyvinyl chloride, and mixtures or conjoined layers of any two or more thereof.

51. An assembly according to claim 39 wherein said support layer has a thickness in the range of about 0.010 up to about 0.5 inches.

52. An assembly according to claim 39 wherein said support layer has a void volume in the range of about 10 up to about 98 percent.

53. An assembly according to claim 39 wherein said second substantially water impervious membrane is resistant to acidic aqueous media, basic aqueous media, and/or organic media.

54. An assembly according to claim 53 wherein said second substantially water impervious membrane is prepared from a polymer selected from the group consisting of a polyester, a polyolefin, a polyamide, a polyether, a polyether-etherketone, a polyimide, a polyetherimide, a polysulfone, a polysulfonyl, a polyethersulfone, a poly(meth)acrylate, a polyurethane, an epoxy, a polysiloxane, a polyphenylene oxide, and combinations of any two or more thereof.

55. An assembly according to claim 53 wherein said second substantially water impervious membrane further comprises a reinforcing material.

56. An assembly according to claim 55 wherein said reinforcing material is selected from the group consisting of woven glass, non-woven glass, woven aramid fibers, non-woven aramid fibers, woven liquid crystal polymer fibers, non-woven liquid crystal polymer fibers, woven synthetic polymer fibers, non-woven synthetic polymer fibers, and randomly dispersed fiber reinforcements.

57. An assembly according to claim 39 wherein said second substantially water impervious membrane has a thickness in the range of about 10 up to about 250 microns.

58. An assembly according to claim 39 wherein said second conductive layer is electrically conductive.

59. An assembly according to claim 58 wherein said second electrically conductive layer is copper or an alloy thereof, nickel or an alloy thereof, nickel or nickel alloy plated copper, rolled copper-invar-copper, aluminum, or a combination of any two or more thereof.

60. An assembly according to claim 59 wherein said second electrically conductive layer is copper or an alloy thereof.

61. An assembly according to claim 58 wherein said second conductive layer defines a ground plane.

62. An assembly according to claim 39 wherein said first conductive layer is adhesively attached to said first substantially water impervious membrane employing a suitable adhesive.

63. An assembly according to claim 62 wherein said suitable adhesive is (1) resistant to attack by acidic aqueous media, basic aqueous media and/or organic media, (2) cures to a non-tacky surface, and/or (3) does not raise the dielectric constant of the finished assembly to more than 3.5.

64. An assembly according to claim 62 wherein said suitable adhesive is suitable for curing by UV, thermal or radical processes.

65. An assembly according to claim 64 wherein said suitable adhesive is selected from the group consisting of an epoxy, a polyester, an acrylic, a urethane, a rubber, a cyanoacrylate, and combinations of any two or more thereof.

66. An assembly according to claim 39 wherein said suitable adhesive is a pressure sensitive adhesive.

67. An assembly according to claim 39 wherein said suitable adhesive is suitable for curing by UV thermal or radical processes.

68. An assembly according to claim 67 wherein said suitable adhesive is selected from the group consisting of an epoxy, a polyester, an acrylic, a urethane, a rubber, a cyanoacrylate, and combinations of any two or more thereof.

69. An assembly according to claim 39 wherein said support layer is adhesively attached to said second substantially water impervious membrane employing a suitable adhesive.

70. An assembly according to claim 69 wherein said suitable adhesive is a pressure sensitive adhesive.

71. An assembly according to claim 69 wherein said suitable adhesive is suitable for curing by UV, thermal or radical processes.

72. An assembly according to claim 71 wherein said suitable adhesive is selected from the group consisting of an epoxy, a polyester, an acrylic, a urethane, a rubber, a cyanoacrylate, and combinations of any two or more thereof.

73. An assembly according to claim 39 wherein said second conductive layer is adhesively attached to said second substantially water impervious membrane employing a suitable adhesive.

74. An assembly according to claim 73 wherein said suitable adhesive is (1) resistant to attack by acidic aqueous media, basic aqueous media and/or organic media, (2) cures to a non-tacky surface, and/or (3) does not raise the dielectric constant of the finished assembly to more than 3.5.

75. An assembly according to claim 73 wherein said suitable adhesive is suitable for curing by UV, thermal or radical processes.

76. An assembly according to claim 75 wherein said suitable adhesive is selected from the group consisting of an epoxy, a polyester, an acrylic, a urethane, a rubber, a cyanoacrylate, and combinations of any two or more thereof.

77. An assembly according to claim 39 wherein the dielectric constant of the assembly falls in the range of about 1.15 up to about 3.5.

78. A stacked assembly comprising a plurality of assemblies according to claim 39.

* * * * *

UNITED STATES PATENT AND TRADEMARK OFFICE
CERTIFICATE OF CORRECTION

PATENT NO. : 6,703,114 B1
DATED : March 9, 2004
INVENTOR(S) : Chester Light Guiles et al.

It is certified that error appears in the above-identified patent and that said Letters Patent is hereby corrected as shown below:

Column 11,
Line 5, after the word "the" delete "fished" and insert therefor -- finished --.

Signed and Sealed this

Fifth Day of October, 2004

JON W. DUDAS
*Director of the United States Patent and Trademark Office*